United States Patent
Shefer

(10) Patent No.: US 7,218,264 B1
(45) Date of Patent: May 15, 2007

(54) ASYNCHRONOUS ANALOG TO DIGITAL CONVERTER

(75) Inventor: Mordechai Shefer, Haifa (IL)

(73) Assignee: Trusight Ltd.

( * ) Notice: Subject to any disclaimer, the term of this patent is extended or adjusted under 35 U.S.C. 154(b) by 0 days.

(21) Appl. No.: 11/318,474

(22) Filed: Dec. 28, 2005

Related U.S. Application Data

(60) Provisional application No. 60/639,300, filed on Dec. 28, 2004.

(51) Int. Cl.
*H03M 1/34* (2006.01)

(52) U.S. Cl. ........................ 341/162; 341/155

(58) Field of Classification Search ............... 341/118, 341/120, 172, 161, 162
See application file for complete search history.

(56) References Cited

U.S. PATENT DOCUMENTS 5,499,027 A * 3/1996 Karanicolas et al. ........ 341/120
6,933,876 B1 * 8/2005 Underbrink et al. ........ 341/162

* cited by examiner

*Primary Examiner*—Brian Young
(74) *Attorney, Agent, or Firm*—Mark M. Friedman

(57) ABSTRACT

An analog-to-digital converter includes a plurality of analog stages. Each stage produces, in response to analog input, a digital output that corresponds to a most significant bit of the stage's input and an analog output that corresponds to the remainder of the input. The input of each stage except the first stage is the analog output of the preceding stage.

4 Claims, 1 Drawing Sheet

ASYNCHRONOUS ANALOG TO DIGITAL CONVERTER

This patent application claims the benefit of U.S. Provisional Patent Application No. 60/639,300 filed Dec. 28, 2004

FIELD AND BACKGROUND OF THE INVENTION

The present invention relates to Data Acquisition and, more particularly, to Analog to Digital Converter (ADC).

Analog-to-digital conversion (ADC) refers to the transformation of real world physical data—which is analog in nature, namely continuous and of infinite resolution—into digital, or binary format where the size of each variable is expressed as a binary word of a prescribed length. The need for this transformation comes from the fact that any further processing of said data is commonly done digitally. The analog-to-digital transformation generally takes two stages. In the first stage the physical data is measured by an appropriate sensor that commonly translates it into a certain voltage through a given scale factor. At this stage the data is within the level of the voltage, therefore is still in the analog form. The second stage is the actual transformation of the sensor's output voltage into a digital word. This is independently done by the analog-to-digital-converter.

For example, in digital cameras, the scenery light is commonly focused by lenses on a plane inside the camera, where it is being translated into a matrix of voltages by a matrix of photo-detectors that comprises the image sensor and is appropriately placed in the camera's focal plane. The output voltages of said image sensor matrix cells or "pixels" are then sequentially sampled and inputted into the ADC that transforms the data into a matrix of digital words, that are then ready to undergo further digital image processing. In digital video cameras, as in other real-time on-line applications (e.g., flight control) the most important merits of performance of ADC are speed of conversion, stability, and accuracy—which is the ADC signal to noise ratio. In on-line real-time applications the ADC process is commonly done in hardware (HW).

HW ADC devices are therefore the subject of a quite intensive development for over quarter century now. Most of the existing ADC devices however consist of mixtures of analog and intensive, sometimes iterative, digital computations. This mixed technology approach results in rather expensive devices with inherent speed and accuracy limits, required input sample-hold with cumbersome input-synchronization, and with possible tendency to instability. Another disadvantage of mixed technology ADC is great hazard of digital to analog cross-talk that causes electronic noise which further jeopardizes the conversion accuracy.

There is thus a widely recognized need for, and it would be highly advantageous to have, an only-analog ADC that does not need input sample-hold and synchronization, whose signal flow is strictly unidirectional, with no digital-to-analog cross-talk, and thereby with no room for configuration-induced instability, or configuration-induced speed and accuracy limitations.

SUMMARY OF THE INVENTION

According to the present invention there is provided an analog-to-digital converter including a plurality of analog stages, each stage producing, in response to an analog input thereto: (a) a digital output that corresponds to a most significant bit of the analog input of the each stage; and (b) an analog output that corresponds to a remainder of the analog input of the each stage relative to the most significant bit of the analog input of the each stage; and wherein the analog input of every stage except for a first stage is the analog output of a preceding stage.

The present invention successfully addresses the shortcomings of the presently known configurations by providing an innovative and novel way of asynchronous analog to digital conversion (ADC), where no digital computations are made, thereby no iterations or feedback loops are needed, and no synchronization of the ADC to possible input sampling clock is required.

According to further features in preferred embodiments of the invention described below the present ADC consists of serially connected chain of identical stages—one stage per each bit of the ADC parallel output, where the ADC analog input is connected to the most significant bit (MSB) stage, that feeds the next less significant bit stage, and so on, down to the last stage that belongs to the least significant bit (LSB).

According to still further features in the described preferred embodiments, in each stage the half full scale of the input signal is firstly subtracted from the input signal and the difference is compared to zero. If said difference is positive than the digital output of the stage is set to "1", and said difference is multiplied by 2 and passed as an input to the next less significant bit stage. If said difference is negative than the digital output of the stage is set to "0" and the stage's input is multiplied by 2 and passed as an input to the next less significant bit stage.

BRIEF DESCRIPTION OF THE DRAWINGS

The invention is herein described, by way of example only, with reference to the accompanying drawings, wherein.

DESCRIPTION OF THE PREFERRED EMBODIMENTS

In the following preferred embodiment description all numerical values are typical "nominal". Any person who is knowledgeable in the art of analog circuits design shall recognize that in practice it is impossible to maintain any numerical value in absolute accuracy. Therefore a case-dependent statistical tolerance (e.g., standard deviation) is commonly assumed. The size of said tolerance is up to the device designer to determine.

The principles and operation of an ADC according to the present invention may be better understood with reference to the drawings and the accompanying description.

Figure 1:
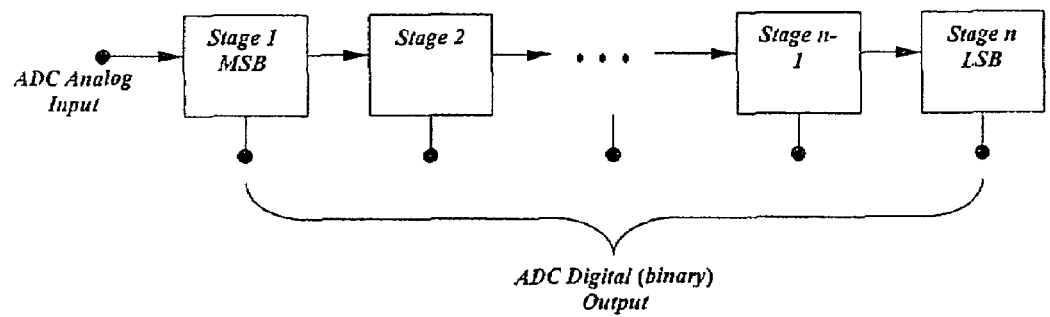
FIG. 1 is a block scheme of the present invention.

Referring now to the drawings, FIG. 1 illustrates a chain of identical stages—one stage per each desired bit of the digital output. The stages are arranged in the order of the bits—starting with the most significant bit (MSB) and ending with the least significant bit (LSB). The analog voltage is inputted to the first, MSB stage. Each stage continuously outputs its own bit in a standard binary format, so that the overall ADC output is a parallel binary word composed of the binary outputs of all the stages. One can arbitrarily decrease the present ADC wordlength by disregarding some least significant bits, or increasing the wordlength by adding more stages to the chain.

Figure 2:
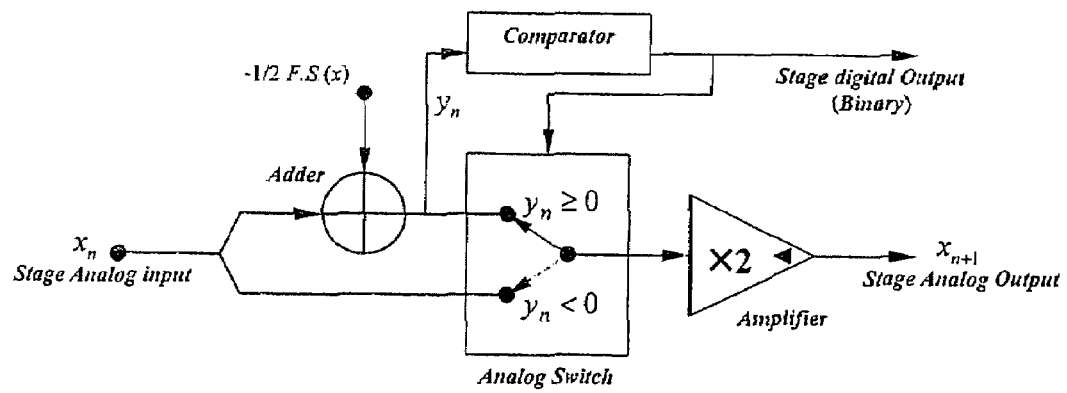
FIG. 2 is a description of the structure of each of the ADC identical stages of FIG. 1.

FIG. 2 illustrates the structure of each of the ADC identical stages of FIG. 1. Each stage—say, the n-th stage—of the present ADC embodiment consists of an analog adder, analog comparator, analog single-pole-double-throw (SPDT) switch and analog amplifier whose nominal gain is 2. The analog stage n input, from the next higher significant bit stage (or from the input signal, in case of the MSB stage) $x_n$ is fed simultaneously into an adder and into one throw of the analog switch. The adder subtracts nominal half of the input full-scale voltage from the input $x_n$, and the resulting difference $y_n$ is fed into a comparator. The comparator's binary output, which is also the stage binary output, equals 1 if $y_n \geq 0$ and 0 if $y_n < 0$. The stage binary output also controls the analog switch so that the analog switch passes $y_n$ to the input of the analog amplifier if $y_n \geq 0$ and the analog switch passes $x_n$ to the input of the analog amplifier if $y_n < 0$. The amplifier's analog output $x_{n+1}$ is the input to the next less significant bit stage.

While the invention has been described with respect to a limited number of embodiments, it will be appreciated that many variations, modifications and other applications of the invention may be made.

What is claimed is:

1. An analog-to-digital converter comprising a plurality of analog stages, each said stage producing, in response to an analog input thereto:
   (a) a digital output that corresponds to a most significant bit of said analog input of said each stage; and
   (b) an analog output that corresponds to a remainder of said analog input of said each stage relative to said most significant bit of said analog input of said each stage;
   wherein said analog input of every said stage except for a first said stage is said analog output of a preceding said stage;
   and wherein each said stage includes:
   (a) an analog adder for subtracting half of a full-scale input of said each stage from said analog input of said each stage;
   (b) an analog amplifier; and
   (c) a switch for selecting, as input to said analog amplifier:
      (i) said analog input of said each stage if an output of said analog adder is less than zero, and
      (ii) otherwise, an output of said analog adder.

2. The analog-to-digital converter of claim 1, wherein each said stage further includes:
   (d) an analog comparator for controlling said switch in response to said output of said analog adder.

3. The analog-to-digital converter of claim 2, wherein, for each said stage, said digital output of said each stage is an output of said analog comparator of said each stage.

4. The analog-to-digital converter of claim 1, wherein, for each said stage, said analog output of said each stage is an output of said analog amplifier of said each stage.

* * * * *